(12) United States Patent
Johnson

(10) Patent No.: US 7,085,668 B2
(45) Date of Patent: Aug. 1, 2006

(54) TIME MEASUREMENT METHOD USING QUADRATURE SINE WAVES

(75) Inventor: Gerald H. Johnson, Andover, MN (US)

(73) Assignee: Teradyne, Inc., Boston, MA (US)

(*) Notice: Subject to any disclaimer, the term of this patent is extended or adjusted under 35 U.S.C. 154(b) by 22 days.

(21) Appl. No.: 10/923,488

(22) Filed: Aug. 20, 2004

(65) Prior Publication Data
US 2006/0052982 A1    Mar. 9, 2006

(51) Int. Cl.
*G04F 1/00*    (2006.01)
(52) U.S. Cl. .......................... 702/117; 702/72; 702/78; 702/176; 714/700
(58) Field of Classification Search ................ 702/117, 702/109, 108, 176, 159, 177, 178, 72, 78; 714/700
See application file for complete search history.

(56) References Cited

U.S. PATENT DOCUMENTS

| | | | |
|---|---|---|---|
| 5,191,336 A | 3/1993 | Stephenson | 341/111 |
| 5,263,012 A | 11/1993 | Muirhead | 368/119 |
| 5,566,139 A | 10/1996 | Abshire | 368/118 |
| 5,903,523 A | 5/1999 | Peck | |
| 6,609,077 B1 | 8/2003 | Brown et al. | 702/117 |

OTHER PUBLICATIONS

Berry, Andrew "Dual Time To Digital Converter For Delay-Line Readout of Position-Sensitive Gas-Filled Detectors" American Institute of Physics, Rev. Sci,. Instrum. 64 (5), May 1993, pp. 1222-1228.

Lampton, M. and Raffanti, R., "A High-Speed Wide Dynamic Range Time-To-Digital Converter" American Institute of Physics, Rev. Sci,. Instrum. 65 (11), Nov. 1994, pp. 3577-3584.

*Primary Examiner*—John Barlow
*Assistant Examiner*—Hien Vo
(74) *Attorney, Agent, or Firm*—David J. Rikkers; Brown Rudnick Berlack Israels LLP

(57) ABSTRACT

A time measurement circuit includes N time stamping units that each includes a dual sinusoid interpolator for achieving high timing resolution. The time measurement circuit is capable of time stamping input signals at a high re-trigger rate, and is thus well suited for quickly measuring the timing jitter of test signals in automatic test systems.

25 Claims, 6 Drawing Sheets

TIME MEASUREMENT METHOD USING QUADRATURE SINE WAVES

BACKGROUND

1. Field of the Invention

This invention relates generally to time measurement, and, more particularly, to time measurement circuits and methods for use with automatic test equipment.

2. Description of Related Art

Automatic test equipment (ATE) is commonly used for testing semiconductor components and electronic assemblies. ATE reduces costs to manufacturers of electronics by allowing them to test their products early in the manufacturing process. Early testing allows defective units to be identified and discarded before substantial additional costs are incurred. In addition, ATE allows manufacturers to grade different units according their tested levels of performance. Better performing units can then be sold at generally higher prices.

ATE relies heavily upon accurate time measurements for its diagnostic precision. In ATE systems, time is generally measured between "events." Events generally correspond to signal transitions. For example, an event can be a digital signal going from low to high, or an analog signal crossing a predefined threshold at the input to a comparator. Regardless of their origin, events generally translated to signal edges, which can then be used to trigger time measurement circuitry.

Several techniques have been used to measure the timing of events in automatic test equipment. One technique involves the use of a high speed clock and a digital counter. A first event, generally called a START event, causes the clock to begin incrementing the counter at a rate of once per clock cycle. A second event, generally called a STOP event, causes the counter to stop incrementing. According to this technique, the time interval between START and STOP is computed as the number of counts held by the counter times the clock period. Although this technique works well for measuring intervals that are relatively long in relation to the clock period, its resolution is limited to the clock period.

Another time measurement technique has been developed that significantly improves resolution. As in the technique above, a digital counter is incremented to produce a coarse count of clock cycles between START and STOP. However, time is also measured between the START event and the clock, and between the STOP event and the clock, using linear interpolation. The coarse count is then adjusted to account for time measured in these leading and trailing intervals.

Linear interpolation is generally accomplished with an analog ramp circuit, which is arranged to measure the leading and trailing intervals. According to this technique, a current source is switched to a capacitor upon the occurrence of an event (e.g., START or STOP). In response to the event, the voltage across the capacitor is linearly charged from a baseline value toward an upper limit. Upon a subsequent clock edge, a sampling circuit (such as an analog-to-digital converter with a sample-and-hold) samples the capacitor voltage. Once the sample is taken, the capacitor is discharged. Owing to the linear nature of the ramp, the sampled voltage is directly proportional to the time between the event and the clock edge, and can be converted to time by linear interpolation.

The ramp technique greatly improves resolution. Rather than being limited by the clock period, resolution is limited by clock period divided by the number of bits that the sampling circuit applies to its measurement of the ramp.

Although resolution is greatly improved, we have recognized that the ramp technique involves certain shortcomings. For example, it employs complex analog circuitry, which generally requires careful design by expert engineers. When design specifications are changed, such as for developing new products, expensive redesigns are often required. Perhaps most significantly, a relatively long delay (often tens of clock periods) is generally needed to restore the ramp to an accurate baseline value. This delay limits the re-trigger time of the ramp, and hence limits the rate at which successive measurements can be made. In automatic test equipment, measurement rate is an important figure of merit. Systems that can complete measurements at higher speeds can reduce test times, and thus can reduce the overall costs associated with testing electronics.

In recent years, a great deal of emphasis has been placed on the ability of ATE to measure the timing jitter of test signals. As is known, "timing jitter" refers to variations in the timing locations of signal edges. Jitter can include random components as well as periodic components. Jitter is generally ascertained by repeating a signal edge a large number of times and repeatedly measuring its location. An automatic test system then computes statistical variations in the edge location to provide a measure of jitter.

As jitter measurement becomes a more important feature of automatic test equipment, the rate at which time measurements can be conducted becomes more critical. It would therefore be desirable for an automatic test system to include high resolution time measurement circuits that can be re-triggered at high speed. It would also be desirable to avoid some of the other drawbacks of the ramp technique.

BRIEF DESCRIPTION OF THE DRAWINGS

The ensuing description will be better understood by reference to the accompanying drawings, in which.

DETAILED DESCRIPTION OF THE PREFERRED EMBODIMENT

A time measurement circuit for automatic test equipment employs a multi-phase reference signal consisting of at least two components of the same frequency, but having different phase. One or more counters are provided to count cycles of the multi-phase reference signal, or component(s) thereof.

According to one variation, a first counter receives a first component of the multi-phase reference signal and a second counter receives a second component. Each counter counts cycles of the respective component. Because the components have different phase, the contents of the first and second counters are generally identical, except that one is delayed with respect to the other. When an event to be measured occurs, the contents of both counters are latched by respective memory elements (e.g., registers).

According to another variation, one counter is provided, which receives one of the components of the multi-phase reference signal. The counter is coupled to data inputs of two different memory elements (e.g., registers). The registers are configured such that one of them is delayed with respect to the other (by delaying data, clock, or both). When an event occurs, the registers latch their respective input data. Owing to the delay between the registers, the registers hold values of the counter that correspond to different instants in time.

For both variations, a sampling circuit is provided for sampling the components of the multi-phase reference signal substantially at the instant that the event occurs. A translating circuit converts the samples for that event to a phase value. Because the event effectively clocks the registers asynchronously, the contents of one of the registers may not be stable if data and clock to that register change at nearly the same time. However, we have recognized that phase value from the translating circuit identifies when the event occurs relative to the components, and can thus be used to infer which of the registers is more likely to contain stable contents than the other. Applying the phase value, a selector chooses the contents of the more stable register, to produce a coarse count. A combiner combines the selected coarse count with the phase value to produce an accurate time measurement for the event.

Since this technique does not require a ramp circuit, the associated retrigger delays are eliminated and measurement rate is improved. Other advantages are also achieved.

In the preferred embodiment, time measurement instruments are constructed for automatic test equipment with a number of time stamping units. These units allow for simultaneous, parallel time measurement of events from a unit under test, and are particularly well suited for high speed jitter measurement.

Figure 1:
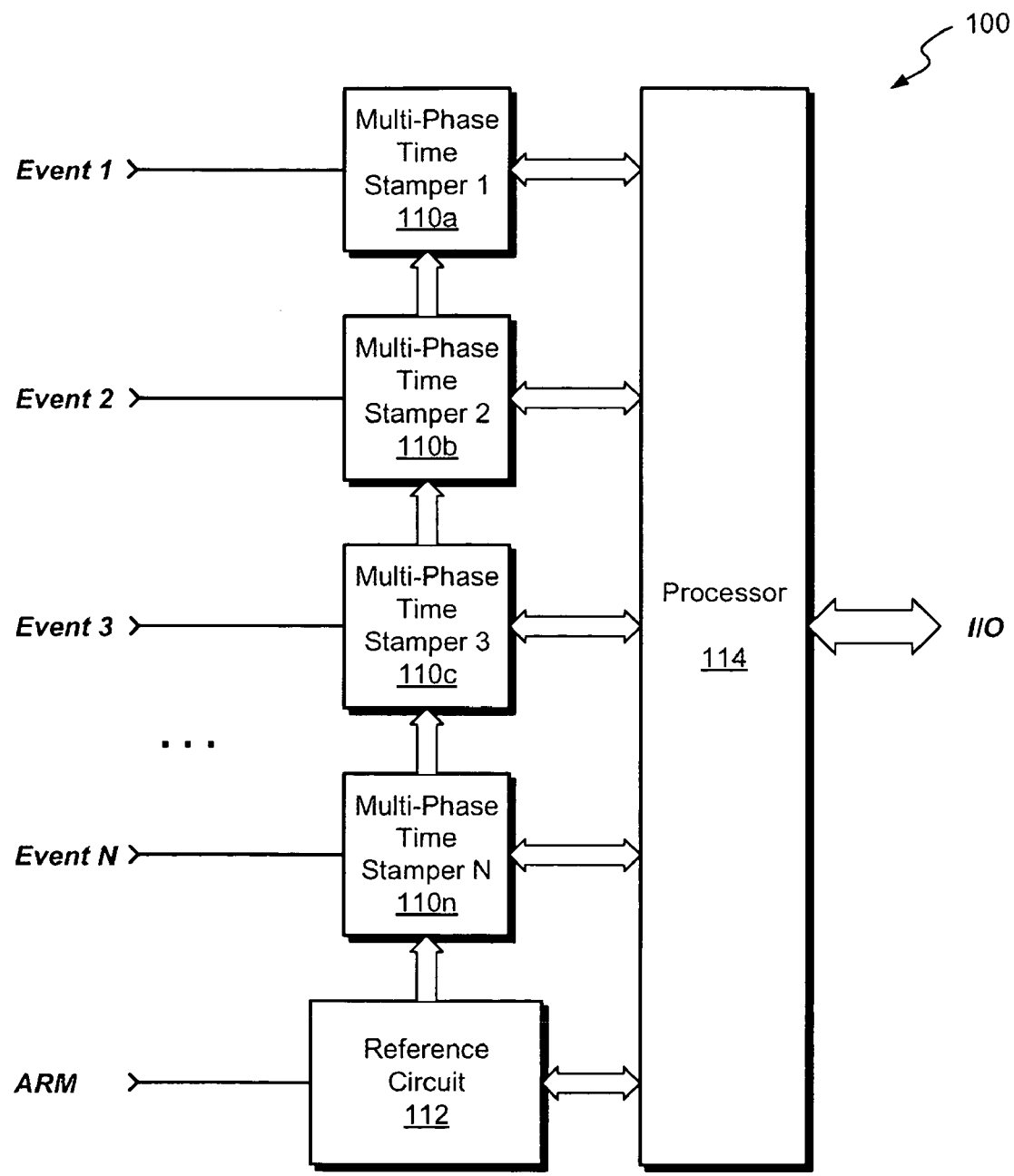
FIG. 1 is a block diagram of an illustrative embodiment of an N-channel time stamping circuit.

FIG. 1 shows an illustrative embodiment of a time measurement circuit 100. The time measurement circuit 100 includes N time measurement, e.g., time stamping units 110a–110n, a reference circuit 112, and a processor 114. In the preferred embodiment, N is a power of 2 (i.e., 4, 8, 16, 32, etc.). This is not required, however, and N can be any positive integer. The time stamping units 110a–110n are each coupled to respective inputs (i.e., Events 1–N) for receiving input signals conveying events to be measured.

The reference circuit 112 provides reference signals and other common signals to the time stamping units. It preferably receives an ARM input for selectively activating and deactivating the time stamping units 110a–110n.

Each of the time stamping units 110a–110n is coupled to the processor 114. The processor is preferably programmed to compare different values (i.e., "time stamps") for generating conventional time measurements, such as time interval, frequency, rise time, fall time, and so forth. The processor 114 is also preferably programmed to analyze statistical properties of time stamps, or of groups thereof, which is useful in computing the timing jitter of input signals.

Figure 2:
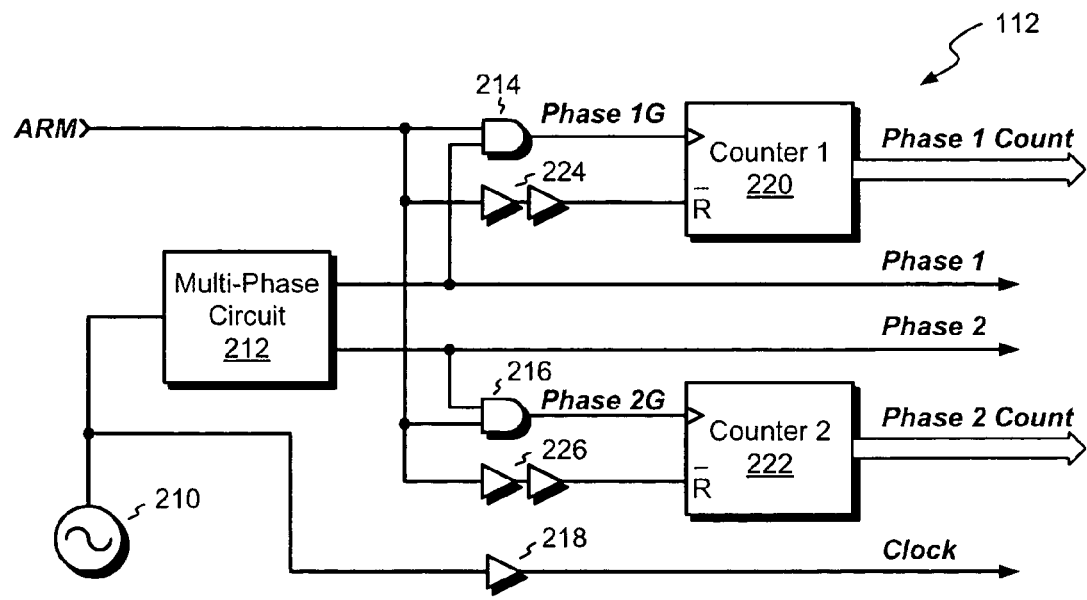
FIG. 2 is a simplified schematic of an illustrative embodiment of a reference circuit that is suitable for use in the N-channel time stamping circuit of FIG. 1.

FIG. 2 shows an illustrative embodiment of the reference circuit 112. The reference circuit includes an oscillator 210 for generating a periodic signal. In the preferred embodiment, this periodic signal is a highly stable sinusoid. The periodic signal is fed to a multi-phase generating circuit 212. In response, the multi-phase generating circuit 212 produces a multi-phase reference signal. This signal preferably consists of two components, "PHASE1" and "PHASE2." Alternatively, additional components of different phase can be produced.

The components of the multi-phase reference signal have the same frequency as one another, but have different phase. Preferably, their frequency is the same as that of the periodic signal from the oscillator 210. The phase difference between PHASE1 and PHASE2 is preferably 90 degrees. The precise phase difference can vary substantially from 90-degrees, however, as long as the phase difference is known or can be determined through calibration.

The multi-phase generating circuit 212 need not be complex. Preferably, it is implemented as a signal splitter (such as a "T" or a power splitter), wherein one output is delayed with respect to the other. It can also be implemented as a Hilbert filter, for producing a pair of output signals in precise quadrature. The only requirement of the multi-phase generating circuit 212 is that it produces at least two signals having the same frequency but different phase. The phase difference is preferably highly stable over time and temperature.

Preferably, AND gates 214 and 216 convert PHASE1 and PHASE2 to gated binary signals, PHASE1G and PHASE2G. These gated signals are enabled only when ARM is true.

In the preferred embodiment, PHASE1G and PHASE2G are each used to clock respective counters, a first counter 220 and a second counter 222. Consequently, whenever ARM is true, the first counter 220 increments upon each cycle of PHASE1 and the second counter 222 increments upon each cycle of PHASE2.

The counters produce respective counts, "PHASE1 COUNT" and "PHASE2 COUNT." Because the inputs to the counters 220 and 222 are essentially phase shifted versions of each other, the outputs of these counters are generally identical, except that one is delayed with respect to the other.

The counters 220 and 222 are preferably configured to reset whenever ARM is false. This configuration ensures that the contents of the first and second counters 220 and 222 always track each other. When ARM goes true, the counters preferably come out of their reset states. Logic gates 224 and 226 provide a short delay in the reset path of the counters. This delay ensures that the counters remain reset for a short time after ARM goes true, to prevent them from falsely incrementing (i.e., upon the rising edge of ARM when the respective gated phase component is also true).

In the preferred embodiment, a buffer 218 provides a clock signal ("CLOCK") for controlling synchronous hardware within the time stamping units 110a–110n. The buffer 218 creates CLOCK by "squaring off" the output of the oscillator 210 and re-referencing it to digital logic levels that are compatible with downstream circuitry. CLOCK can alternatively be produced by driving the buffer 218 with one of the components of the multi-phase reference signal.

Figure 3:
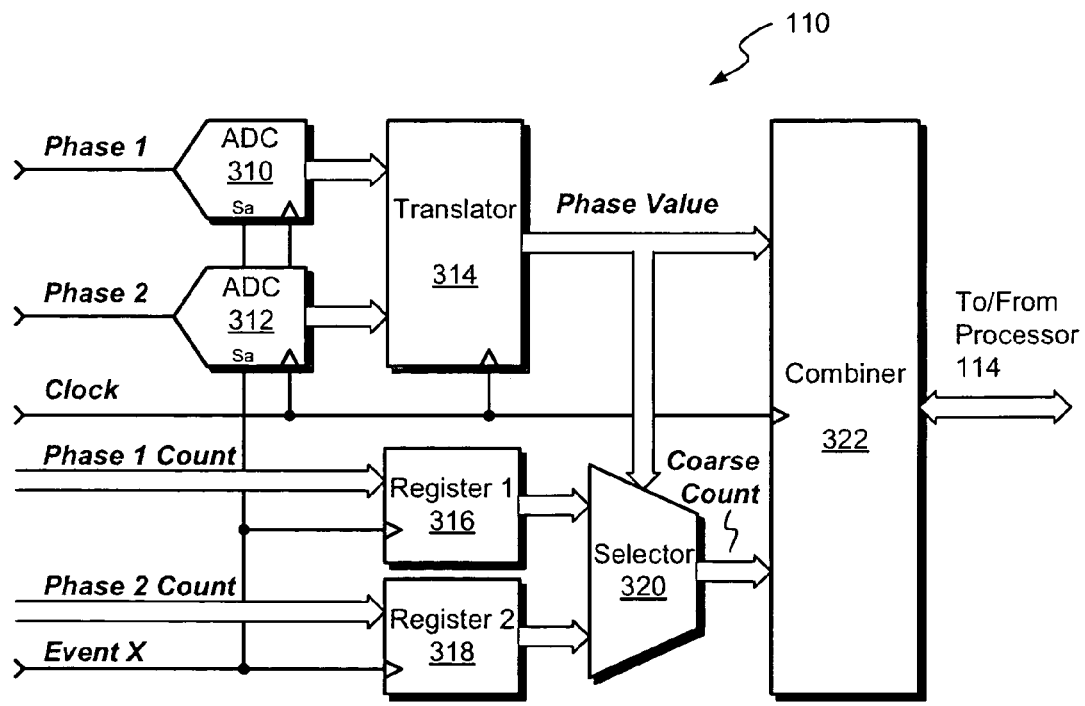
FIG. 3 is a simplified schematic of an illustrative embodiment of a time stamping unit that is suitable for use in the N-channel time stamping circuit of FIG. 1.

FIG. 3 shows an illustrative embodiment of a time stamping unit 110 of FIG. 3. The time stamping unit 110 of FIG. 3 corresponds to any of the time stamping units 110a–110n shown in FIG. 1.

The illustrative time stamping unit 100 includes a first ADC (analog-to-digital converter) 310 and a second ADC 312. Each ADC has an analog input that receives a respective component of the multi-phase reference signal. The first and second ADCs each preferably have a sample input ("SA") coupled to the input of the time stamping unit 100 for receiving incoming events ("EVENT X"). Upon the occurrence of an event, each ADC samples the component at its respective input. Preferably, the first and second ADC's 310 and 312 each include an internal sample-and-hold circuit (not shown). Also, the ADCs preferably have a pipelined architecture and are clocked by CLOCK. The integral sample-and-hold and the pipelined architecture allow the ADCs 310 and 312 to be operated at a high rate of speed with high throughput.

A translator 314 is coupled to the outputs of the ADCs 310 and 312. The translator 314 maps each pair of digital values from the ADCs to a corresponding phase value, which the translator 314 provides at its output. This phase value identifies a phase, or, equivalently, a time, relative to the multi-phase reference signal when the event occurs.

As is known, a one-to-one correspondence exists between each pair of values produced by the ADCs and the phase of the multi-phase reference signal at which the event occurs. Various ways are known to determine the phase value, using various types of periodic waveforms (e.g., sinusoids, triangle waves, trapezoidal waves, and others). To illustrate the operative principle, consider the fact that a sinusoid crosses any given signal level exactly two times per period. Thus, a single measurement of one sinusoid does not unambiguously identify a phase value. Phase ambiguity can be resolved, however, by providing a second sinusoid that is phase shifted with respect to the first by a known amount, and by sampling both sinusoids simultaneously upon the occurrence of the event. One of the two phase values implied by the first sinusoid will be the same as one of the two phase values implied by the second sinusoid. The matching value represents the correct phase.

Continuing with reference to FIG. 3, the time stamping unit 100 also includes first and second memory elements (e.g., a first register 316 and a second register 318), a selector 320, and a combiner 322. The first register 316 has a data input coupled to the output of the first counter 220. The second register 318 has a data input coupled to the output of the second counter 222. Both registers 316 and 318 are clocked by the incoming event.

The registers and the selector help to resolve uncertainty in the coarse count of cycles. Uncertainty arises because the registers 316 and 318 are each clocked asynchronously with changes in their input data. As is known, asynchronous clocking can give rise to unpredictable behavior (e.g., metastability) in digital circuits when data and clock both change at approximately the same time. This unpredictable behavior may include very long settling times before the latched data becomes stable, or even erroneous data. To be clocked predictably, digital circuits generally require that data be stable for some interval of time before the clock is asserted. This interval is generally called "setup time." These circuits also generally require that data remain stable for some interval after the clock is asserted, which is generally called "hold time."

As already stated, the contents of the first and second counters 220 and 222 are generally identical, but are delayed by different amounts (i.e., offset in time by a fraction of a period). To ensure that the stability of both counters is never suspect for the same event, this delay difference must generally be at least as great as the sum of the setup and hold times of the registers, plus any circuit errors that may add skew between these registers. With this condition met, data stored in one of the registers 316 and 318 are always certain to be stable following the occurrence of an event.

Figure 4:
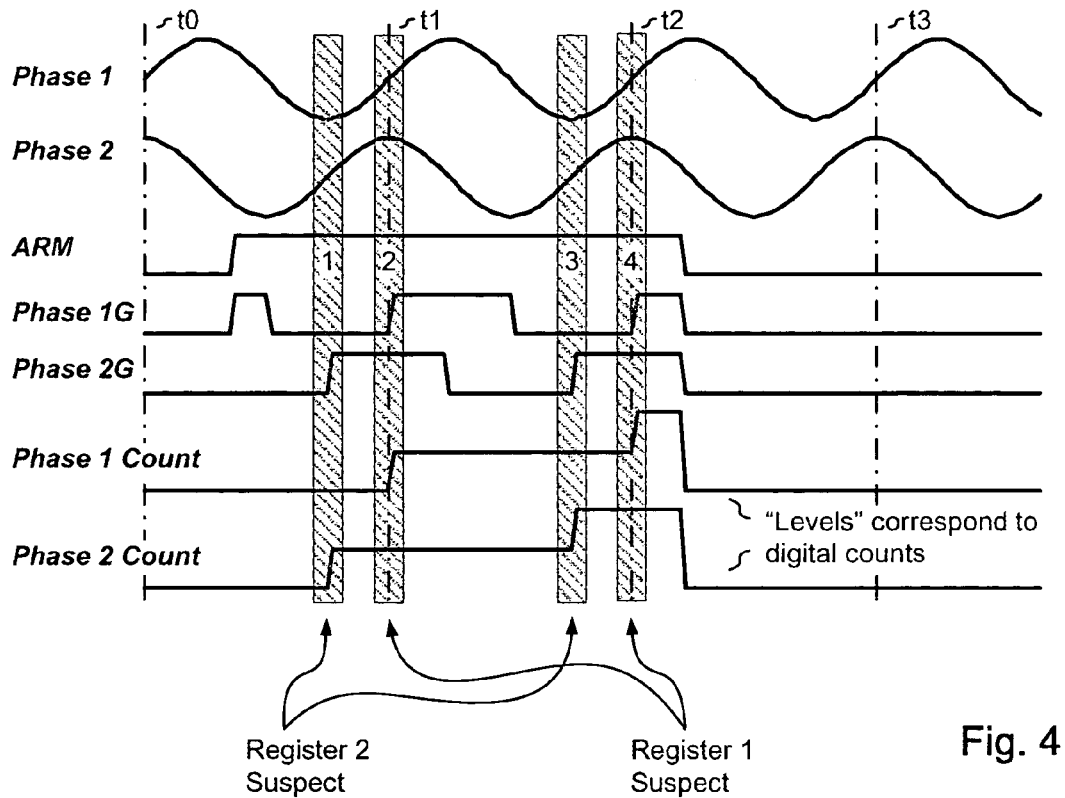
FIG. 4 is a waveform diagram showing signals involved in the operation of the N-channel time stamping circuit of FIG. 1.

Turning briefly to FIG. 4, different signals of the time stamping unit 110 are shown on the same time scale. The two components of the multi-phase reference signal, PHASE1 and PHASE2, appear at the top of FIG. 4 in a quadrature relationship (i.e., with a 90-degree phase difference). ARM is shown immediately below these signals. Whenever ARM is true, gated versions of PHASE1 and PHASE2, i.e., PHASE1G and PHASE2G, are produced. Generally, PHASE1 COUNT and PHASE2 COUNT are each incremented one count for each positive transition of PHASE1G and PHASE2G, respectively. Note, however, that the first rising edge of PHASE1G is ignored (by action of the delay circuit 214) because it is caused by ARM going positive, not PHASE1. Both counts are preferably reset when ARM goes false. It should be noted that PHASE1 COUNT and PHASE2 COUNT are preferably digital values. FIG. 4 depicts them as "levels" for merely illustrative purposes.

The vertical bands shown in FIG. 4 indicate regions of suspect stability. If the event to be measured occurs during the intervals denoted by the second band or the fourth band, the setup and/or hold requirements of the first register 316 may not be met, and the contents of the first register may not be stable. Similarly, if the event occurs during the intervals denoted by the first band or the third band, the setup and/or hold requirements of the second register 318 may not be met, and the contents of the second register may not be stable.

Returning to FIG. 3, the selector 320 can be seen to have first and second inputs for respectively receiving the contents of the first and second registers 316 and 318. The selector 320 also has a control input for receiving the phase value from the translator 314. The role of the selector 320 is to select a value from among the first and second registers that is stable, and to provide that value as an accurate "coarse count" of cycles.

The selector 320 bases its selection of input upon the phase value. Generally speaking, the selector checks whether the phase value falls within any of the regions of suspect stability, i.e., the first through fourth vertical bands of FIG. 4. If the phase value falls within the second or fourth bands, the contents of the first register are regarded as suspect and the selector 320 selects the contents of the second register as the coarse count. Similarly, if the phase value falls within the first or third bands, the contents of the second register are regarded as suspect and the selector selects the contents of the first register as the coarse count. If the phase value does not fall within any suspect region, the contents of either register can be used.

Once the selector 320 has chosen a coarse count, it passes the coarse count on to the combiner 322. The combiner receives this coarse count as well as the phase value from the translator 314. According to one implementation, the combiner 322 converts the coarse count and the phase value to comparable units of time, and adds them to provide an accurate reading of time (i.e., a time stamp) for the event. Conversion of the coarse count to time is generally achieved by multiplying the coarse count by the period of the multi-phase reference signal (or any of its components). Conversion of the phase value to time is generally achieved using conventional trigonometry, i.e., by multiplying the phase value by the period and dividing by 2*PI.

To ensure that phase is measured consistently for different events, a convention is preferably adopted that identifies a zero-phase baseline for phase measurements. Arbitrarily, this baseline is chosen to be the positive zero-crossing of PHASE1. FIG. 4 shows boundaries between different periods according to this baseline, with designations t0, t1, and t3. It should be understood, however, that any point can be used as a baseline, on either component, as long as it is used consistently.

Again, to ensure consistency, it should be recognized that the contents of the first and second registers 316 and 318 differ by one count when the phase value falls between the positive zero-crossing of the PHASE2 and the positive zero-crossing of PHASE1. To resolve this ambiguity, the selector 320 preferably adjusts the coarse count, as needed, in response to the measured phase value. For example, if the first register 316 produces the coarse count, the count is already aligned with the baseline and no adjustment is needed. However, if the second register 318 produces the coarse count, and the phase value falls between the positive zero-crossings of the components, the selector subtracts one from the coarse count to properly align the count with the baseline.

In the preferred embodiment, the following somewhat simplified technique is used for selecting the coarse count. The coarse count is always taken to be PHASE1 COUNT unless the event coincides with an even numbered suspect band, in which case the coarse count is taken to be PHASE2 COUNT minus one.

In the preferred embodiment, the translator 314 is implemented with a look-up table. Samples from the first ADC 310 preferably provide an "X index" into the look-up table, and samples from the second ADC 312 preferably provide a "Y index." The combination of an X index with a Y-index identifies a single phase value, which the translator 314 provides as output. All expected combinations of X and Y are stored in the lookup table. The translator 314 may be implemented in other ways. For instance, if the components of the multi-phase reference signal are in precise quadrature, the translator can determine the phase value by computing the four-quadrant arc-tangent of the sample of PHASE2 divided by the sample of PHASE1 (i.e., Arc-Tan (Sine/Cosine)). In this case, the translator would be equipped with computational capability.

In the preferred embodiment, the combiner 322 is implemented very simply, in a manner that does not require it to perform any calculations. To combine the coarse count with the phase value to produce a time stamp, the combiner 322 preferably concatenates bits from the selector 320 with bits from the translator 314. In this arrangement, the coarse count forms the MSBs (Most Significant Bits) of a digital value and the phase value forms the LSBs (Least Significant Bits).

The selector 322 is preferably implemented as a digital circuit with combinatorial logic. In the preferred embodiment, the selector 320, translator 314, registers 316 and 318, and combiner 322 are implemented together within a single FPGA (Field Programmable Gate Array). Alternatively, they could be implemented in other ways, such as with an ASIC (Application Specific Integrated Circuit) or using discrete logic and memory.

When used in ATE applications, the time stamping circuit 110 provides a number of appealing properties. First, measurements can be made at the full sampling rate of the ADCs. Re-trigger time is reduced, thus reducing test time and increasing throughput. Second, the circuit is easily scalable. To provide a time stamping circuit with greater time resolution, it is necessary only to use ADCs with inherently higher voltage resolution or to drive the circuit with faster reference signals. If the ADCs cannot keep pace with the faster reference signals, the new ADCs may be replaced with faster units, but replacing the ADCs is a relatively simple design change. Laborious analog re-design and debug are not required. The same FPGA housing the translator 314, registers 316 and 318, selector 320, and combiner 322 can be re-used in different circuits and with different ADCs.

Figure 5:
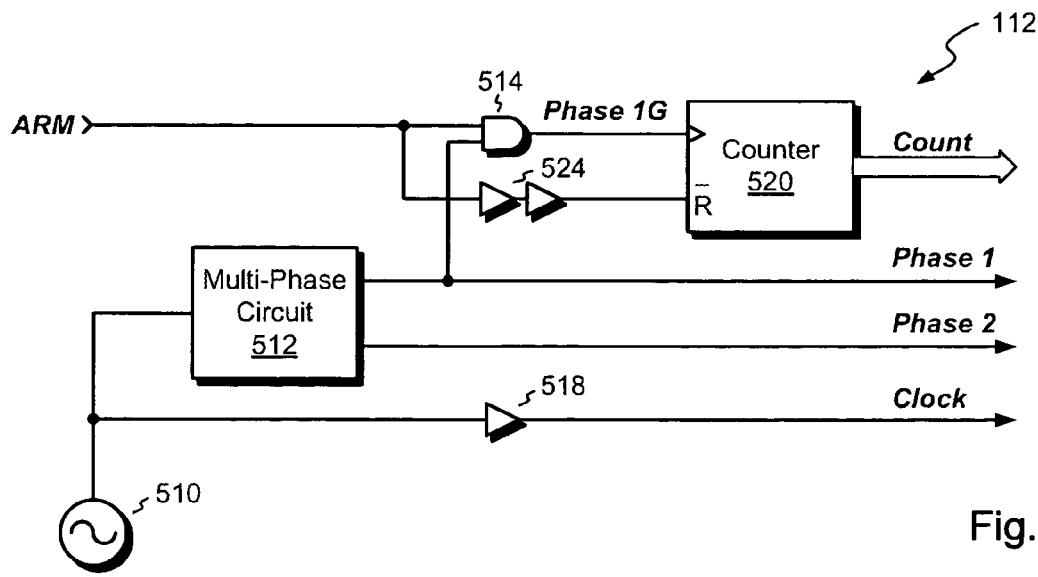
FIG. 5 is a simplified schematic of an alternative embodiment of a reference circuit that is suitable for use in the N-channel time stamping circuit of FIG. 1.
Figure 6:
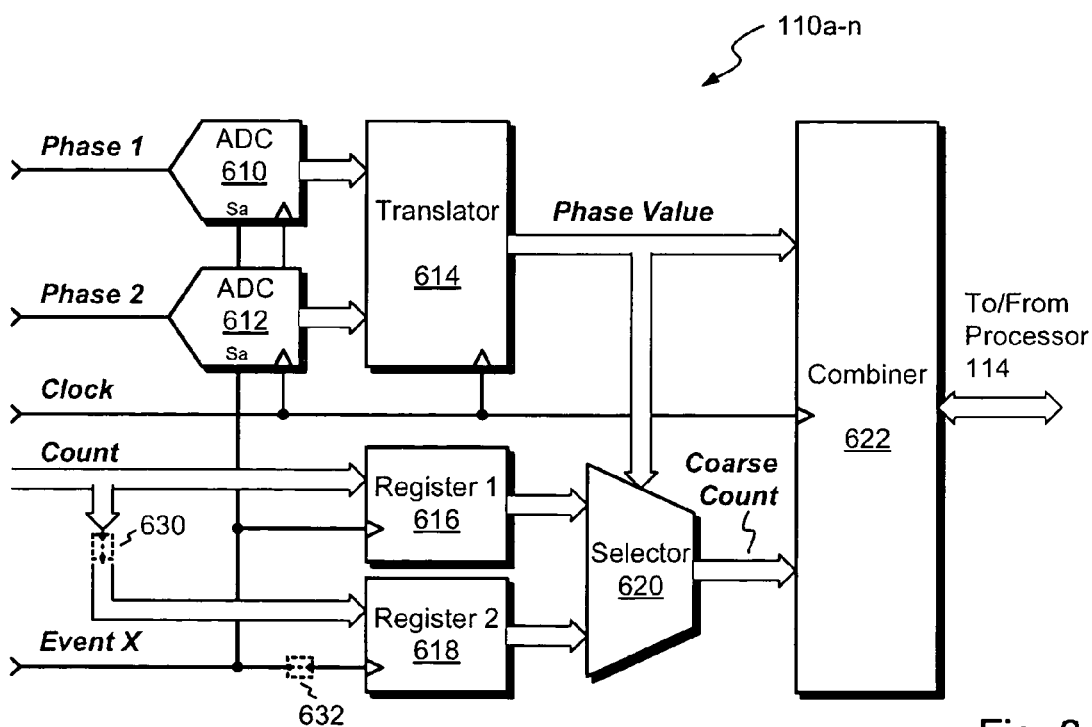
FIG. 6 is a simplified schematic of an alternative embodiment of a time stamping unit that is suitable for use with the reference circuit of FIG. 5 in the N-channel time stamping circuit of FIG. 1.

FIGS. 5 and 6 show an alternative embodiment of the reference circuit 112 and time stamping unit 110. As shown in FIG. 5, a single counter 520 may be used in place of the two counters 220 and 222 of FIG. 2. The counter 520 gets its input from one of the components of the multi-phase reference signal. It can alternatively get its input directly from CLOCK. A single AND gate 514 enables or disables the counter, depending upon the state of the ARM signal. As shown in FIG. 6, two memory elements are used, e.g., register1 616 and register2 618, similarly to FIG. 3. However, in this case, the registers 616 and 618 are both coupled to the same counter, i.e., counter 520.

To ensure that the contents of one of the registers are always stable, data and/or clock to these registers are offset in time. For example, data en route to one register can be subjected to a longer delay than the same data en route to the other register (e.g., by way of delay 630). Alternatively (or in addition), the clock (Event X) en route to one register can be delayed with respect to the clock en route to the other register (e.g., via delay 632). Clearly, it is generally easier to delay the clock, which generally consists of only one or two signals, than it is to delay the data, which generally consists of many signals. However, delaying either will accomplish the same result.

Regardless of whether clock or data is delayed, the amount of the delay should be at least as great as the sum of the setup and hold times of the registers, plus any circuit skew, to ensure that the contents of one register are always stable. Preferably, the amount of the delay should correspond to approximately 90-degrees of phase of the multi-phase reference signal.

In other respects, the circuits of FIGS. 5–6 are constructed and operate much as described above in connection with FIGS. 2–3.

Figure 7:
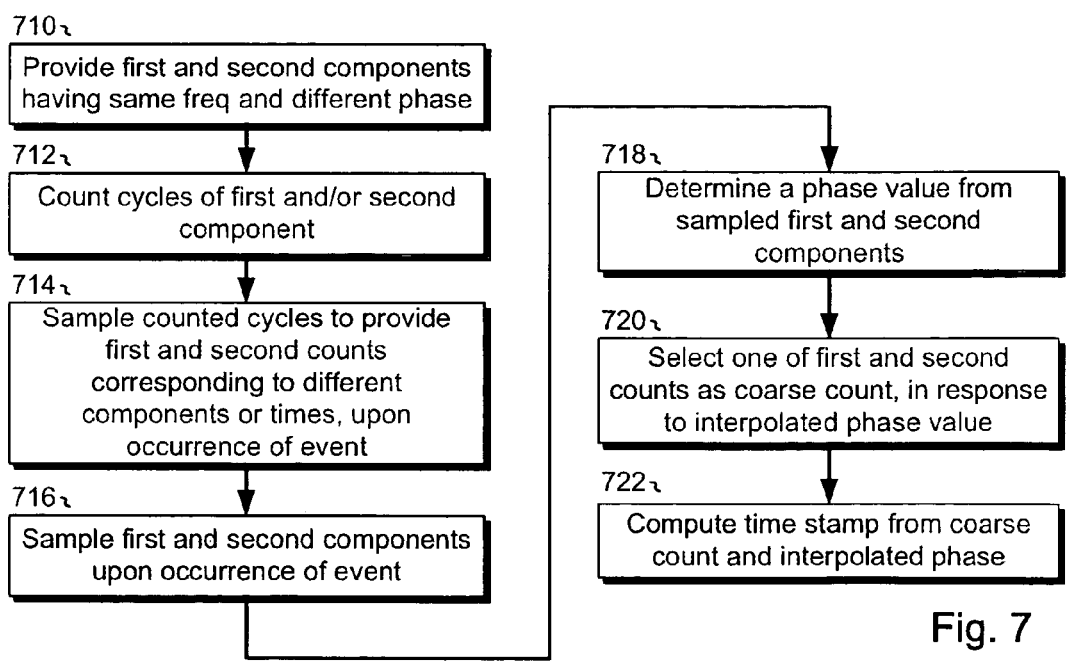
FIG. 7 is a flowchart showing a process for generating time stamps of timing events.

FIG. 7 shows an illustrative embodiment of a method for generating time stamps and provides a short summary of process performed by the circuits described above. At step 710, first and second components of a multi-phase reference signal are provided. These may be generated locally or provided from an external source. These components have the same frequency, but are offset in phase by an amount that is either known or can be determined through calibration.

At step 712, cycles of one or more of the components are counted. In the illustrative embodiment of FIGS. 2 and 3, two counters are used to count cycles of respective components. If illustrative the embodiment of FIGS. 5 and 6, a single counter is used for counting one component.

At step 714, an incoming event is received. In response to the event, the counted cycles are sampled (e.g., latched). If two counters are used, the contents of both counters are latched by separate registers. If one counter is used, the contents of that counter are latched by two registers, corresponding to the contents of the counter at two times.

At step 716, the event is further responded to by sampling the components of the multi-phase reference signal themselves (e.g., PHASE1 and PHASE2). The samples are preferably taken substantially instantaneously after the event occurs. Steps 714 and 716 are preferably performed at approximately the same time, i.e., substantially at the instant that the incoming event is received.

At step 718, the samples of the components are used to determine a phase value associated with the event. This is preferably achieved by matching the samples acquired at step 716 with a value stored in a look-up table.

At step 720, one of the sampled cycles is selected as the coarse count, in response to the phase value determined at step 718. Values of suspect stability are excluded.

Last, at step 722, the selected coarse count is combined with the phase value to provide a time stamp for the event.

Once time stamps are generated, they are generally sent to the processor 114, where they may be compared with other time stamps or otherwise processed. The processor 114 can readily compare time stamps to conduct conventional time measurements. For example, by computing differences between successive time stamps from a single time stamping unit 110, one may readily compute the period of an input signal. Measurements can also be made by comparing time stamps between different time stamping units 110. These include measurements of skew, rise time, fall time, and other time intervals. Since the time stamping units 110 operate with substantial independence, there is no restriction that necessarily limits the minimum measurement interval. Measured intervals computed from different time stamping units can include negative readings and zero-time readings, as well as positive readings.

The processor 114 is also preferably capable of measuring timing jitter of signals applied to the time stamping units 110. The fast re-trigger time and high throughput of the time stamping units 110 make these circuits particularly suitable for jitter measurement, which generally involves large numbers of measurements.

Figure 8:
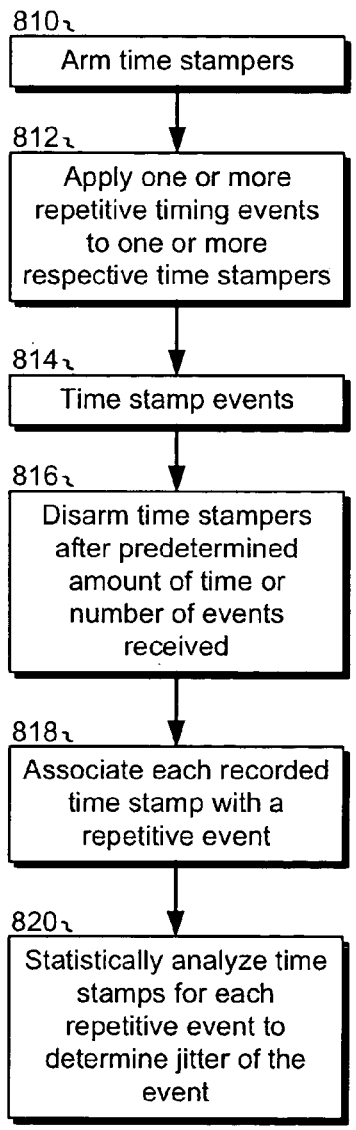
FIG. 8 is a flowchart showing a process for gathering and statistically analyzing time stamped values.

FIG. 8 shows an illustrative embodiment of a process for determining timing jitter of one or more test signals. To enable time stamping, a time stamping units 110 is armed at step 810. At step 812, a test signal is applied to the input of a time stamping unit. The test signal is made to repeat, such that the event for which jitter is to be determined is repeated a generally large number of times. Each time the event occurs, the time stamping unit 110 records a time stamp for that event (step 814). After the event has been repeated a suitable number of times, the time stamping unit 110 is disarmed (step 816), and data collection generally ends. The above process can be conducted for a single input, or for multiple inputs in parallel.

The processor 114 next analyzes the collected data to ascertain the timing jitter of the inputted event(s). This includes (step 818) associating each recorded time stamp with an event. This step is generally straightforward if only a single event is provided at each input (such as for measuring the jitter of a clock). However, the problem becomes more complex if the test signal is a repeating sequence of data, such as is provided in a serial bit stream. Under these circumstances, time stamps are preferably grouped based on the order in which events are received. For example, if the input signal contains M different events, the processor 114 should preferably group together every M events (e.g., Event 1, (1+M), (1+2M), etc. in one group; 2, (2+M), (2+2M), etc. in another group, and so on). Once the events are properly grouped, the processor statistically analyzes each group (step 820). This generally includes computing mean event time (relative to some reference value) and standard deviation. Using this technique, one can readily ascertain the timing jitter of any repeating data signal.

Jitter can be measured for one input signal at a time, or can be measured for different input signals simultaneously. Because time stamping units 100 operate independently, all time stamping units can be configured to record time stamps at up to their maximum rate, simultaneously. Recently released computer busses, such as Intel Corporation's PCI Express, provide eight bits of high-speed, parallel data. A time measurement circuit including at least eight time stamping units 110 can measure jitter on all of the signals of this bus simultaneously.

In the preferred embodiment, the time measurement circuit 100 is housed in an instrument for an automatic test system. The instrument preferably includes eight time stamping units 110. Many instruments of this type can be installed into a single automatic test system, depending upon the level of capability desired.

Figure 9:
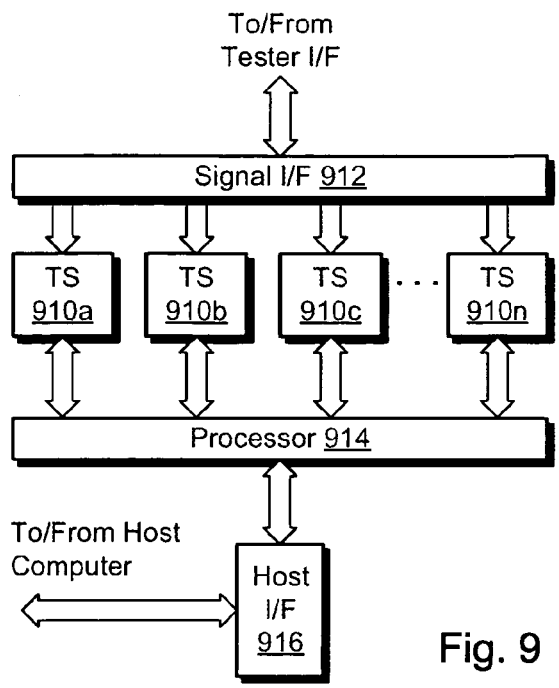
FIG. 9 is a block diagram of an instrument that includes time stamping circuits.

FIG. 9 shows an illustrative embodiment of an instrument that includes a time measurement circuit. The instrument includes time stamping units 910a–910n, which communicate with a processor 914. The time stamping units and the processor are essentially of the type described herein. Input signals are provided to the time stamping units via a signal interface 912, which is in turn arranged to receive signals from a UUT (unit under test) during testing. A host interface 916 is provided for communicating between the processor 914 and an external computer. The computer may be a main test computer, such as one that is capable of running test programs, or it may be a subsidiary computer that manages instruments.

Figure 10:
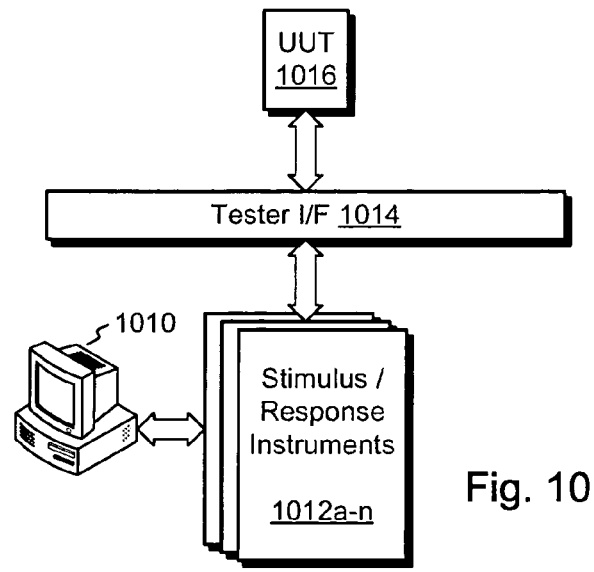
FIG. 10 is a block diagram of an automatic test system that includes time stamping circuits.

FIG. 10 shows an illustrative embodiment of an automatic test system that includes one or more time measurement circuits. Preferably, these time measurement circuits are supplied as instruments, such as the instrument of FIG. 9. Alternatively, they may be provided as circuits found on other instruments, or as parts of other electronic assemblies of a test system. The test system includes a main test computer 1010, which communicates (either directly or via a subsidiary processor) with instruments 1012a–1012n. The instruments may include stimulus instruments for providing stimuli to a UUT 916, response instruments for sensing signals from the UUT 916, or instruments that combine both stimulus and response functions. The instruments communicate test signals with the UUT via a tester interface 914. The tester interface may include spring loaded contact pins, blind mate coaxial connectors, direct-wired connectors, or other types of interconnections. The host computer generally runs a test program for directing the activities of the instruments and exercising the UUT. With this arrangement, UUTs can be tested to determine whether they function properly and meet their specifications. They can also be graded into different classes according to their performance in critical areas, such as speed.

Although the time stamping units of the measurement circuit 100 operate at high speed, certain applications may require even greater speed. For example, certain serial data signals, such as those for SerDes and SONET technologies, can have data rates of tens of Giga-bits per second. For testing these signals, additional capabilities are required.

Figure 11:
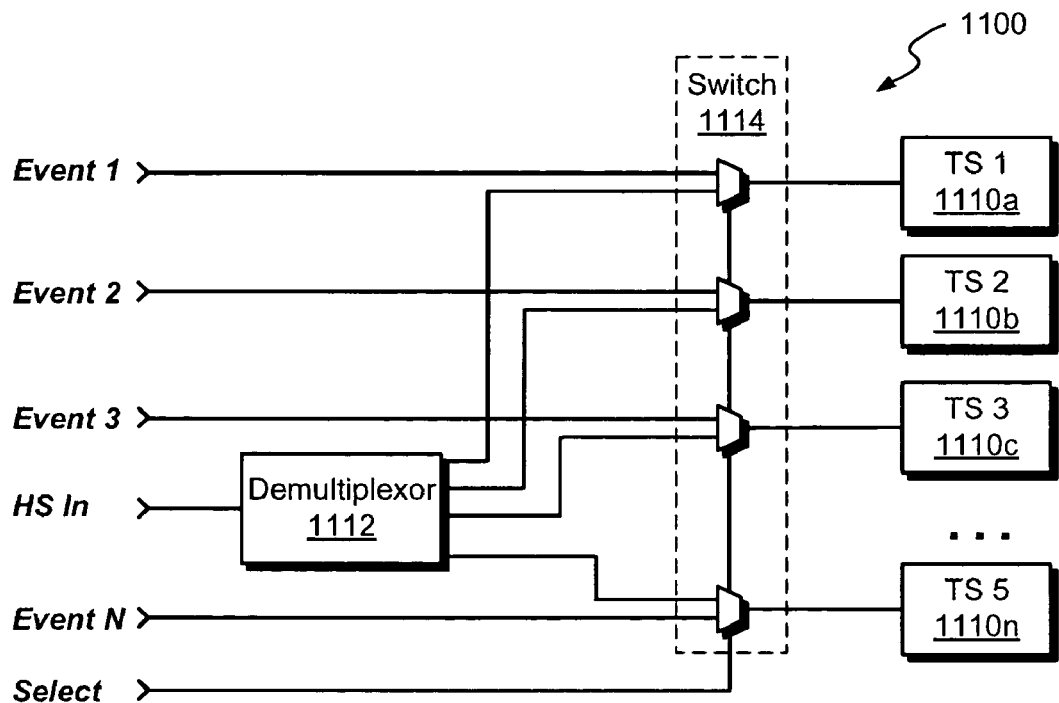
FIG. 11 is a simplified schematic of an N-channel time stamping circuit, wherein the channels are switchable between direct inputs and outputs of a demultiplexor.

FIG. 11 shows an illustrative embodiment of a time measurement circuit 1100 that is adaptable for measuring high speed signals. The time measurement circuit 1100 includes N time stamping units 1110a–1110e, which are essentially similar to the time stamping units 110. The time measurement circuit 1100 also includes a switching circuit 1114. The switching circuit 1114 is preferably controlled by a common select signal, "Select." By configuring the switching circuit one way, the time stamping units 1110 are driven by separate input signals (Events 1–8), similarly to the way they are in FIG. 1. However, by configuring the switching circuit 1114 another way, the time stamping units 1110 are driven by outputs of a demultiplexor 1112.

The demultiplexor 1112 has an input for receiving a high speed signal, HSIN. The demultiplexor is arranged to provide signal edges at its outputs in response to signal edges at its input. Input edges from HSIN occurring successively in time are provided to successive outputs. Data rate is consequently reduced by at least a factor of N, where N is the number of outputs of the demultiplexor.

The circuit 1100 may be operated in different modes. In a first mode, different input signals can be measured in parallel. To assume this mode, the circuit 1100 is configured to switch the inputs (Event 1-8) directly to the time stamping circuits 1110. In a second mode, the time stamping units 1110 all receive their inputs from outputs of the demultiplexor 1112 A user can decide whether to configure the circuit 1100 in the first mode or the second mode based upon the speed of the input signal to be measured. Timing jitter can be measured in either the first mode or the second mode, using the methods described above.

Figure 12:
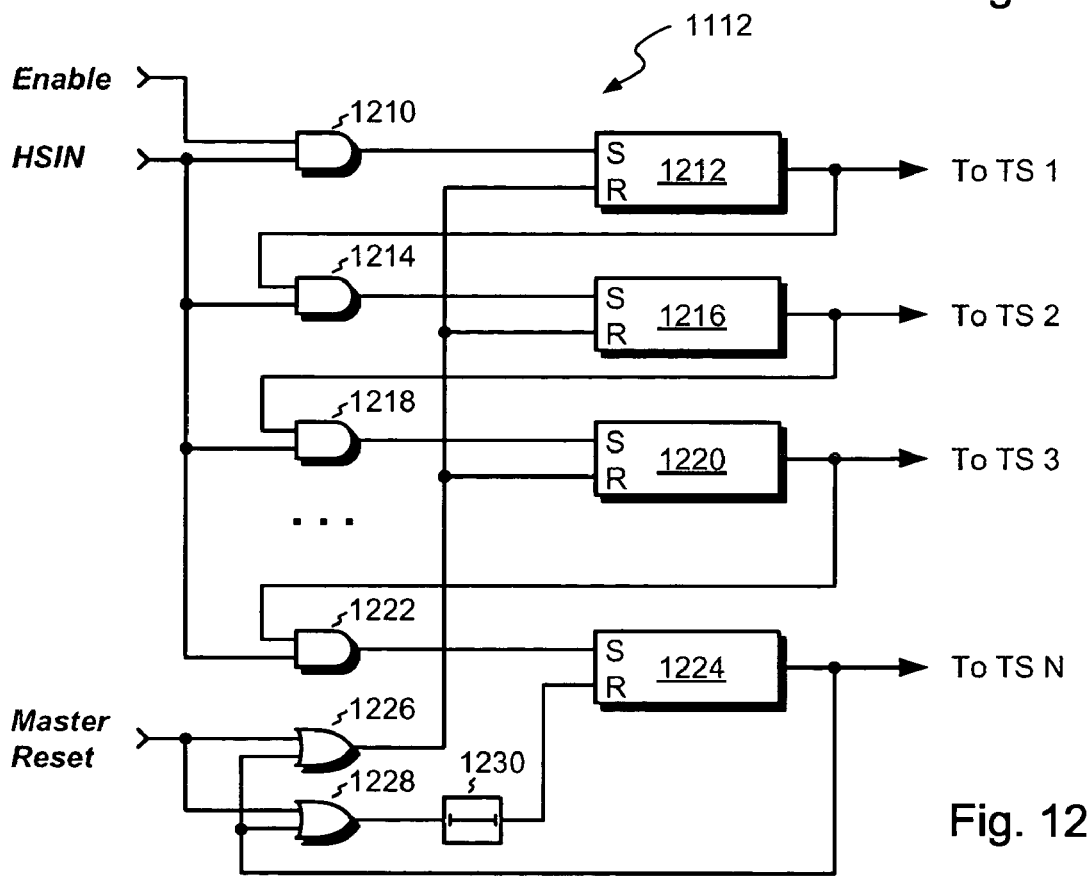
FIG. 12 is a simplified schematic of a demultiplexor that is suitable for use in the circuit of FIG. 11.

FIG. 12 shows an illustrative embodiment of a demultiplexor that is suitable for use in connection with the circuit of FIG. 11. The demultiplexor includes N logic gates, such as AND gates 1210, 1214, 1218, and 1222. It also includes N memory units, such as Set/Reset flip-flops 1212, 1216, 1220, and 1224. Each flip-flop has a SET input, a RESET input, and an output.

Each AND gate has a first input for receiving and enable signal and a second input for receiving HSIN. The AND gates and flip-flops are connected together in series and in an alternating fashion. The output of each AND gate is connected to the SET input of the next flip-flop in the series (for setting the flip-flop), and the output of each flip-flop is connected to the first input of the next AND gate in the series (for arming the next flip-flop). The output of each flip-flop is also connected to the input of a respective time stamping unit 1110 for providing a signal edge to be measured.

The first flip-flop 1212 in the series receives its enable signal from an external source, such as the processor 114 or some other control source. All flip-flops are initially reset. Once the external enable signal goes true, the next rising edge of HSIN sets the first flip-flop 1212. The first time stamping unit (110a) then receives an input edge corresponding to the edge of the high-speed input signal. In addition, the next flip-flop (1216) becomes armed.

The next rising edge of the input signal then sets the second flip-flop 1216, without changing the state of the first flip-flop 1212. The second time stamping unit (1010b) receives the edge and the third flip-flop becomes armed. The circuit continues to operate this way until the $N^{th}$ flip-flop 1224 becomes set. In response to this action, the $N^{th}$ time stamping unit receives an edge, and a reset signal is activated.

The output of the last flip-flop 1224 provides the reset signal. The reset signal is passed to an input of OR gates 1226 and 1228. The output of OR gate 1226 is connected to the RESET input of all of the flip-flops, except for the last. These flip-flops are thus reset almost immediately following the receipt of the last signal edge. The output of OR gate 1228 is connected, via optional delay element 1230, to the RESET input of the last flip-flop 1224. The delay circuit 1230 slightly delays the resetting of the last flip-flop 1224 by a predicable amount to ensure that the output signal produced by the last flip-flop has a pulsewidth sufficiently long to ensure that the last time stamping unit 1110n can respond to an event.

Both OR gates 1226 and 1228 also receive a Master Reset signal (from the processor 114 or some other control source). Activation of Master Reset forces all flip-flops to assume a reset state.

Resetting the demultiplexor has the affect of arming it to respond to additional events. In particular, an $(N+1)^{st}$ rising edge again sets the first flip-flop 1212 and restarts the process described above. The demultiplexor can operate in this fashion indefinitely, as long as the external enable signal is true.

Importantly, the demultiplexor of FIG. 12 preserves the timing of all edges of HSIN. Edges of HSIN appear at the inputs of the time stamping units slightly delayed (e.g., by two gate delays), but these delays are the same for all measurements. Thus, the time stamping units can measure the edge timing of HSIN, and therefore jitter, with high accuracy.

The switching circuit 1114 preferably includes N muxes. Muxes are preferred in this application over relays or other types of switches because of their generally high bandwidth. Each mux preferably has a first input for receiving an event directly (e.g., one of Events 1–8) and a second input connected to an output of the demultiplexor 1112. The muxes are preferably commonly controlled (all are switched the same way together by a single select signal), although this is not required.

Having described certain embodiments, numerous alternative embodiments or variations can be made. For example, the multi-phase reference signal has been shown and described as consisting of two phases. However, this is not required and additional phases may be provided. Although the components of the multi-phase reference signal have been shown and described as sinusoids, other wave shapes can be used as well, such as trapezoidal waves and triangle waves.

Also, the ADCs 310, 312, 610, and 612 have been shown and described herein as pipelined ADCs. Although pipelining tends to improve throughput, it is not an essential element of the invention. In addition, the ADCs have been shown and described as having internal sample-and-hold circuits. Alternatively, the sample-and-hold circuits can be provided externally. Moreover, track-and-hold circuits, or other types of sampling devices, may be used in place of sample-and-hold circuits.

As shown and described, a single, multi-phase circuit 212/512 is provided for all time stamping circuits. Sharing of this circuit is generally beneficial, as it reduces the amount of circuitry required to be contained in each time stamping unit. However, this is not essential. Alternatively, each time stamping unit can include its own multi-phase circuit. Preferably, all such multi-phase circuits are driven by the same oscillator signal to ensure that measurements between time stamping units are synchronized.

A similar principle holds true for the counters (220, 222, 520). Preferably, counters are shared among all of the time stamping units. However, this need not be the case. Alternatively, each time stamping unit can include its own counter(s).

Digital portions of the time stamping units 110 and reference circuit 112 have been shown and described as distinct structures. However, as is known, digital functions can be implemented in a variety of equivalent forms that all accomplish essentially the same result. Therefore, the invention is not limited to having separate and distinct digital structures precisely as shown and described.

Those skilled in the art will therefore understand that various changes in form and detail may be made to the embodiments disclosed herein without departing from the scope of the invention.

What is claimed is:

1. A time measurement circuit comprising:
   inputs adaptable for receiving N input signals conveying events; and
   N time measurement units each coupled to a different one of the N inputs and each receiving a plurality of reference signals having the same frequency and different phase,
   wherein each of the N time measurement units includes
   circuitry for providing a phase value, relative to the plurality of reference signals, at which an event occurs;
   a plurality of memory elements each constructed and arranged for storing a value indicative of a count of elapsed cycles of one of the plurality reference signals;
   a selector having a plurality of inputs respectively coupled to the plurality of memory elements and an output for providing one of the plurality of inputs responsive to the phase value;
   multi-phase generating circuitry for generating the plurality of reference signals;
   a first counter coupled to the multi-phase generating circuitry for receiving a first of the plurality of reference signals; and
   a second counter coupled to the multi-phase generating circuitry for receiving a second of the plurality of reference signals,
   wherein the first counter is coupled to a first of the plurality of memory elements and the second counter is coupled to a second of the plurality of memory elements for providing respective counts thereto.

2. A time measurement circuit comprising:
   inputs adaptable for receiving N input signals conveying events; and
   N time measurement units each coupled to a different one of the N inputs and each receiving a plurality of reference signals having the same frequency and different phase,
   wherein each of the N time measurement units includes
   circuitry for providing a phase value, relative to the plurality of reference signals, at which an event occurs;
   a plurality of memory elements each constructed and arranged for storing a value indicative of a count of elapsed cycles of one of the plurality reference signals;
   a selector having a plurality of inputs respectively coupled to the plurality of memory elements and an output for providing one of the plurality of inputs responsive to the phase value;
   multi-phase generating circuitry for generating the plurality of reference signals;
   a counter coupled to the multi-phase generating circuitry and providing a count indicative of a number of cycles of one of the plurality of reference signals,
   wherein the counter is coupled to a first and a second of the plurality of memory elements for providing the count to each of the first and second memory elements;
   wherein the first and second memory elements each comprise a register having a clock input and requirements for setup and/or hold times,
   the clock input of the register of the first memory element is coupled to one of the N inputs through a first delay,
   the clock input of the register of the second memory element is coupled to the same one of the N inputs through a second delay, and
   the difference between the first delay and the second delay is at least as great as the setup and/or hold times of the register.

3. A time measurement circuit comprising:
   inputs adaptable for receiving N input signals conveying events; and
   N time measurement units each coupled to a different one of the N inputs and each receiving a plurality of reference signals having the same frequency and different phase,
   wherein each of the N time measurement units includes
   circuitry for providing a phase value, relative to the plurality of reference signals, at which an event occurs;
   a plurality of memory elements each constructed and arranged for storing a value indicative of a count of elapsed cycles of one of the plurality reference signals;
   a selector having a plurality of inputs respectively coupled to the plurality of memory elements and an output for providing one of the plurality of inputs responsive to the phase value;
   multi-phase generating circuitry for generating the plurality of reference signals;
   a counter coupled to the multi-phase generating circuitry and providing a count indicative of a number of cycles of one of the plurality of reference signals,
   wherein the counter is coupled to a first and a second of the plurality of memory elements for providing the count to each of the first and second memory elements;
   wherein the first and second memory elements each comprise a register having a data input and requirements for setup and/or hold times,
   the data input of the register of the first memory element is coupled to the counter through a first delay,
   the data input of the register of the second memory element is coupled to the counter through a second delay, and
   the difference between the first delay and the second delay is at least as great as the setup and/or hold times of the register.

4. A time measurement circuit comprising:
   inputs adaptable for receiving N input signals conveying events; and
   N time measurement units each coupled to a different one of the N inputs and each receiving a plurality of reference signals having the same frequency and different phase,
   wherein each of the N time measurement units includes
   circuitry for providing a phase value, relative to the plurality of reference signals, at which an event occurs;
   a plurality of memory elements each constructed and arranged for storing a value indicative of a count of elapsed cycles of one of the plurality reference signals;
   a selector having a plurality of inputs respectively coupled to the plurality of memory elements and an output for providing one of the plurality of inputs responsive to the phase value;
   multi-phase generating circuitry for generating the plurality of reference signals;

wherein the circuitry for providing a phase value comprises;
a first ADC (analog-to-digital converter) having an analog input and a digital output, the analog input coupled to a first of the plurality of outputs of the multi-phase generating circuitry; and
a second ADC having an analog input and a digital output, the analog input coupled to a second of the plurality of outputs of the multi-phase generating circuitry,
wherein the first ADC and the second ADC are constructed and arranged to respectively sample signals at their respective inputs responsive to the occurrence of an event, and
wherein the plurality of storage elements are constructed and arranged to respectively sample their respective counts responsive to the occurrence of an event.

5. A time measurement circuit as recited in claim 4, further comprising a translator coupled to the digital output of the first ADC and to the digital output of the second ADC, wherein the translator is constructed and arranged to translate digital values from the first and second ADCs into the phase values.

6. A time measurement circuit as recited in claim 5, wherein the translator has an output, and further comprising a combiner coupled to the output of the translator and to the output of the selector for combining each of the phase values with contents of one of the plurality of storage elements.

7. A time measurement circuit as recited in claim 4, wherein the first and second ADCs each comprise a sample-and-hold circuit.

8. A method for determining when an event occurs, comprising:
(A) providing at least first and second reference signals having the same frequency but different phase;
(B) generating a first count of the first reference signal and a second count of one of the first reference signal and the second reference signal;
(C) sampling the first and second reference signals and the first and second counts, responsive to the occurrence of an event;
(D) determining a phase value responsive to the sampled first and second reference signals;
(E) selecting a coarse count from one of the first and second counts, responsive to the phase value determined in Step D; and
(F) combining the phase value with the selected coarse count to produce a time measurement for the event.

9. A method as recited in claim 8, wherein Step E comprises:
determining whether the phase value substantially coincides with a timing region wherein the first count is incremented; and
if so, identifying the coarse count responsive to the second count.

10. A method as recited in claim 8, wherein Step B comprises:
determining whether the interpolated phase substantially coincides with a timing region wherein the second count is incremented; and
if so, identifying the coarse count responsive to the first count.

11. A time measurement circuit, comprising:
a plurality of inputs adaptable for receiving a plurality of input signals conveying repetitive events;
a plurality of time measurement units, each coupled to a different one of the plurality of inputs; and
a processor, coupled to each of the plurality of time measurement units, for computing statistical variations in the timing of the repetitive events, wherein each time measurement unit includes
at least one storage element for storing a coarse count indicative of a number of elapsed cycles of a multi-phase reference signal when an event occurs; and
a circuit for indicating a phase of the multi-phase reference signal when the event occurs;
wherein the processor comprises
means for associating time measurements into groups corresponding to different repetitive timing events; and
means for computing jitter of each repetitive timing event from variations in the time measurements of each group.

12. A time measurement circuit comprising
N inputs adaptable for receiving N input signals conveying timing events;
a demultiplexor, having an input and N outputs;
N time measurement units; and
a switching circuit, coupled to the N time measurement units, the N outputs of the demultiplexor, and the N inputs, for selectively coupling time measurement units to outputs of the demultiplexor or to ones of the N inputs;
wherein the demultiplexor comprises:
a plurality of memory units each having a first input for setting a digital state of the memory unit, a second input for resetting the digital state of the memory unit, and an output for providing a signal indicative of whether the memory unit is set or reset; and
a plurality of logic gates each having a first input coupled to the input of the demultiplexor, a second input adapted for receiving an enable signal, and an output coupled to the first input of a respective one of the plurality of memory units.

13. A time measurement circuit as recited in claim 12, wherein
the plurality of memory units and the plurality of logic gates are arranged in series and in an alternating fashion.

14. A time measurement circuit as recited in claim 12, wherein the switching circuit comprises N muxes, each having a first input coupled to one of the N inputs, a second input coupled to one of the N outputs of the demultiplexor, and an output coupled to a respective time measurement unit.

15. A time measurement circuit as recited in claim 12, further comprising: a processor, coupled to the N time measurement units, for computing statistical variations in the timing of the repetitive events.

16. A method as recited in claim 15, further comprising:
grouping the data indicative of the valued captured in Step B(i) and B(ii) according to the repetitive event that produced the data; and
for each group computing variations in the values captured in Step B(i) and B(ii) to provide a measure of jitter.

17. A method as recited in claim 16, wherein the events are asynchronous with the multi-phase reference oscillator.

18. A method of measuring timing characteristics of a plurality of signals conveying repetitive events, comprising:
(A) counting cycles of a multi-phase reference oscillator;
(B) upon the occurrence of a timing event from any of the plurality of signals, (i) capturing at least one value indicative of a number of cycles of the reference oscillator counted in Step A at the time that the respective timing event occurs, (ii) capturing a plurality of values indicative of the phase of the multi-phase reference oscillator at the time that the respective timing event occurs; and (iii) storing data indicative of the values captured in Steps B(i) and B(ii);

(C) repeating Step B for different repetitions of timing events; and (D) computing, from the stored data, statistical characteristics of repetitive events.

19. A method of simultaneously measuring jitter of a plurality of test signals, comprising:

(A) receiving a plurality of input signals conveying repetitive events;

(B) applying the plurality of input signals to a plurality of time stamping circuits;

(C) recording a time stamp each time a repetitive timing event is received by any of the plurality of time stamping circuits; and (D) for each repetitive event, calculating variations in the recorded time stamps to produce a measure of jitter in the respective timing event.

20. A method as recited in claim 19, wherein the plurality of test signals are signals that form at least part of a communication bus.

21. A method as recited in claim 20, wherein the communication bus is PCI Express.

22. A method as recited in claim 19, further comprising arming the plurality of time stamping circuits to respond to timing events.

23. A method as recited in claim 19, wherein a different time stamp is recorded each time a timing event occurs while the plurality of time measurement units are armed.

24. An automatic test system, comprising:

a host computer;

at least one instrument, operative in response to commands from the host computer; and a signal interface for establishing electrical contact between nodes of a unit under test and the at least one instrument, wherein the at least one instrument includes N inputs connectable to the signal interface and adaptable for receiving input signals conveying timing events from the unit under test;

N time measurement units, each coupled to a different one of the N inputs, each for generating time stamped values indicative of times at which timing events occur at the respective input, wherein each time measurement unit includes at least one storage element for storing a coarse count indicative of a number of elapsed cycles of a multi-phase reference signal when an event occurs; and an circuit for indicating a phase value relative to the multi-phase reference signal when an event occurs.

25. An instrument for testing electronic components, comprising:

a host interface for communicating with a host computer;

a signal interface for connecting with a unit under test; and a plurality of time stamping circuits, coupled to the signal interface, for measuring times at which events occur at the unit under test, wherein each of the plurality of time stamping circuit includes at least one storage element for storing a coarse count indicative of a number of elapsed cycles of a multi-phase reference signal when an event occurs; and a circuit for indicating a phase value relative to the multi-phase reference signal when an event occurs.

* * * * *

UNITED STATES PATENT AND TRADEMARK OFFICE
CERTIFICATE OF CORRECTION

| | | |
|---|---|---|
| PATENT NO. | : 7,085,668 B2 | Page 1 of 1 |
| APPLICATION NO. | : 10/923488 | |
| DATED | : August 1, 2006 | |
| INVENTOR(S) | : Gerald H. Johnson | |

It is certified that error appears in the above-identified patent and that said Letters Patent is hereby corrected as shown below:

Col. 15 Claim 10, line 57 currently reads as follows:

"10. A method as recited in claim 8, wherein Step B"

Please correct Claim 10, line 57 to read as follows:

--10. A method as recited in claim 8, wherein Step E--

Signed and Sealed this

Tenth Day of April, 2007

JON W. DUDAS
*Director of the United States Patent and Trademark Office*